United States Patent [19]

Ovshinsky et al.

[11] Patent Number: 6,087,674

[45] Date of Patent: Jul. 11, 2000

[54] MEMORY ELEMENT WITH MEMORY MATERIAL COMPRISING PHASE-CHANGE MATERIAL AND DIELECTRIC MATERIAL

[75] Inventors: Standford R. Ovshinsky, Bloomfield Hills; Wolodymyr Czubatyj, Warren; David A. Strand, Bloomfield Township, Oakland County; Patrick J. Klersy, Lake Orion; Sergey Kostylev, Bloomfield Hills; Boil Pashmakov, Troy, all of Mich.

[73] Assignee: Energy Conversion Devices, Inc., Troy, Mich.

[21] Appl. No.: 09/063,174

[22] Filed: Apr. 20, 1998

Related U.S. Application Data

[63] Continuation-in-part of application No. 08/739,080, Oct. 28, 1996, Pat. No. 5,825,046.

[51] Int. Cl.[7] .................................................. H01L 47/00
[52] U.S. Cl. ........................................ 257/2; 257/4; 257/5
[58] Field of Search ...................... 257/1, 2, 3, 4, 257/5, 50; 365/163

[56] References Cited

U.S. PATENT DOCUMENTS

| 3,271,591 | 9/1966 | Ovshinsky | 307/88.5 |
|---|---|---|---|
| 3,685,028 | 8/1972 | Wakabayashi et al. | 340/173 R |
| 3,715,634 | 2/1973 | Ovshinsky | 317/234 |
| 4,710,899 | 12/1987 | Young et al. | 365/113 |
| 5,124,183 | 6/1992 | Nakano et al. | 428/1 |
| 5,557,596 | 9/1996 | Gibson et al. | 369/101 |
| 5,687,112 | 11/1997 | Ovshinsky | 365/163 |
| 5,825,046 | 10/1998 | Czubatyj et al. | 257/2 |

Primary Examiner—Sara Crane
Attorney, Agent, or Firm—Philip H. Schlazer; Marvin S. Siskind; David W. Schumaker

[57] ABSTRACT

An electrically operated, single cell memory element comprising: a volume of memory material defining a single-cell memory element, the memory material comprising a heterogeneous mixture of a phase-change material and a dielectric material; and means for delivering an electrical signal to at least a portion of the volume of memory material. An electrically operated, single-cell memory element comprising: a volume of memory material defining the single-cell memory element, the memory material comprising a phase-change material and a dielectric material where the phase-change material has a plurality of detectable resistivity values and can be set directly to one of the resistivity values without the need to be set to a specific starting or erased resistivity value, regardless of the previous resistivity value of the material, in response to an electrical signal; and means for delivering the electrical signal to at least a portion of the volume of memory material.

15 Claims, 3 Drawing Sheets

MEMORY ELEMENT WITH MEMORY MATERIAL COMPRISING PHASE-CHANGE MATERIAL AND DIELECTRIC MATERIAL

RELATED APPLICATION INFORMATION

This application is a continuation-in-part of U.S. patent application Ser. No. 08/739,080, filed Oct. 28, 1996, now U.S. Pat. No. 5,825,046.

FIELD OF THE INVENTION

The present invention relates generally to an electrically operated memory material. More specifically, the present invention relates to an electrically operated memory element having memory material comprising a phase-change material and a dielectric material.

BACKGROUND OF THE INVENTION

The Ovonic EEPROM is a novel, proprietary, high performance, non-volatile, thin-film electronic memory device. Its advantages include non-volatile storage of data, potential for high bit density and, consequently, low cost because of its small footprint and simple two-terminal device configuration, long reprogramming cycle life, low programming energies and high speed. The Ovonic EEPROM is capable of both analog and digital forms of information storage. Digital storage can be either binary (one bit per memory cell) or multi-state (multiple bits per cell). Only minor modifications are necessary to switch between the two digital modes. For purposes of the instant invention, the terms "memory elements" and "control elements" will be employed synonymously.

The general concept of utilizing electrically writable and erasable phase-change materials (i.e., materials which can be electrically switched between generally amorphous and generally crystalline states) for electronic memory applications is well known in the art, as is disclosed, for example, in U.S. Pat. No. 3,271,591 to Ovshinsky, issued Sep. 6, 1966 and in U.S. Pat. No. 3,530,441 to Ovshinsky, issued Sep. 22, 1970, both of which are assigned to the same assignee as the present invention, and both disclosures of which are incorporated herein by reference.

As disclosed in the '591 and '441 patents, such phase-change materials can be electrically switched between structural states of generally amorphous and generally crystalline local order or between different detectable states of local order across the entire spectrum between completely amorphous and completely crystalline states. That is, the '591 and '441 patents describe that the electrical switching of such materials is not required to take place between completely amorphous and completely crystalline states but rather can be in incremental steps reflecting changes of local order to provide a "gray scale" represented by a multiplicity of conditions of local order spanning the spectrum between the completely amorphous and the completely crystalline states. The early materials described by the '591 and '441 patents could also, if required, be switched between just the two structural states of generally amorphous and generally crystalline local order to accommodate the storage and retrieval of single bits of encoded binary information.

The electrically erasable phase-change memories described in the '591 and '441 patents had a number of limitations that prevented their widespread use. Specifically, the following represent the most significant of these limitations: (i) a relatively slow (by present standards) electrical switching speed, particularly when switched in the direction of greater local order (in the direction of increasing crystallization); (ii) a relatively high input energy requirement necessary to initiate a detectable change in local order; and (iii) a relatively high cost per megabyte of stored information (particularly in comparison to present hard disk drive media).

The phase-change materials described in the '591 and '441 patents were based on changes in local structural order. The changes in structural order were typically accommodated by atomic migration of certain species within the material. Such atomic migration between the amorphous and crystalline states required a time necessary to accommodate the migration, thereby making the switching times and energies relatively high. Materials having reduced atomic migration and thus decreased electrical switching times and energies were disclosed in U.S. Pat. No. 5,166,758 to Ovshinsky, the disclosure of which is incorporated by reference herein. The memory material of the present invention further reduces the electrical switching times and energies of the Ovonic EEPROM.

SUMMARY OF THE INVENTION

An objective of the present invention is to provide a electrically operated memory element having reduced switching current requirements.

This and other objectives are satisfied by an electrically operated, single cell memory element comprising: a volume of memory material defining a single cell memory element, the memory material comprising a heterogeneous mixture of a phase-change material and a dielectric material; and means for delivering an electrical signal to at least a portion of the volume of memory material.

This and other objectives are also satisfied by an electrically operated, single-cell memory element comprising: a volume of memory material defining the single-cell memory element, the memory material comprising a phase-change material and a dielectric material where the phase-change material has a plurality of detectable resistivity values and can be set directly to one of the resistivity values without the need to be set to a specific starting or erased resistivity value, regardless of the previous resistivity value of the material, in response to an electrical signal; and means for delivering the electrical signal to at least a portion of the volume of memory material.

DETAILED DESCRIPTION OF THE INVENTION

Disclosed herein is an electrically operated, single-cell memory element. The memory element comprises a volume of memory material defining the single-cell memory element, and means for delivering an electrical signal to at least a portion of the volume of memory material. The memory material provides for switching within a dynamic range of stable states with low energy inputs at fast speeds.

In one embodiment of the present invention, the memory material comprises a heterogeneous mixture of a phase-change material and a dielectric material. Generally, the phase-change material used in the present invention may be any phase-change material known in the art that is capable of changing from a first detectable state to a second detectable state upon the application of an electrical signal. The phase-change material has a first detectable characteristic when in the first state and a second detectable characteristic when in the second state. Preferably, the first and second detectable characteristics are each electrical resistivities.

Preferably, the phase-change materials can be electrically switched between generally amorphous and generally crystalline states. Examples of phase-change materials were provided in U.S. Pat. No. 3,271,591 and U.S. Pat. No. 3,530,441. The disclosures of both U.S. Pat. No. 3,271,591 and U.S. Pat. No. 3,530,441 are incorporated by reference herein.

As discussed in the '591 and '441 Patents, such phase-change materials can be electrically switched between two different structural states of generally amorphous and generally crystalline local order to accommodate the storage and retrieval of binary coded information. Alternately, the phase-change materials can be electrically switched between different detectable states of local order across the entire spectrum between the completely amorphous and the completely crystalline states. That is, the switching of the phase-change materials can be in incremental steps reflecting changes of local order to provide a "gray scale" represented by a multiplicity of conditions of local order spanning the spectrum between the completely amorphous and the completely crystalline states.

The term "amorphous" refers to a condition which is relatively structurally less ordered or more disordered than single crystal and has a detectable characteristic, such as high electrical resistivity. The term "crystalline" as used herein refers to a condition which is relatively structurally more ordered than amorphous and has at least one detectably different characteristic, such as a lower electrical resistivity.

Other examples of phase-change materials are found in commonly assigned U.S. Pat. No. 5,166,758, U.S. Pat. No. 5,296,716, U.S. Pat. No. 5,534,711, U.S. Pat. No. 5,536,947, and U.S. Pat. No. 5,596,522, and U.S. Pat. No. 5,687,112. The disclosures of U.S. Pat. Nos. 5,166,758, 5,296,716, 5,534,711, 5,536,947, and 5,596,522, and 5,687,112 are incorporated by reference herein.

The phase-change material is preferably "non-volatile". As used herein "non-volatile" means that the phase-change material will maintain the integrity of the information stored by the memory cell (within a selected margin of error) without the need for a periodic refresh. Hence, the set resistivity value can be held constant for archival time periods without losing the integrity of information store therein.

The phase-change material is preferably "directly overwritable" so that the memory elements need not be set to a specific starting point in order to change the information stored within the elements. Preferably, the phase-change materials of the present invention (1) have a plurality of detectable electrical resistivity values, (2) can be switched from any one resistivity value to any other resistivity value in response to an electrical signal, and (3) can be set directly to one of the resistivity values without the need to be set to a specific starting or erased resistivity value, regardless of the previous resistivity value of the material, in response to the electrical signal.

In one embodiment of the present invention, the phase-change material has two detectable electrical resistivity values. This provides for a single-cell memory element having binary storage capabilities. In another embodiment of the present invention, the phase-change material has three or more detectable electrical resistivity values. This provides for a single-cell memory element having multibit storage capabilities.

In another embodiment of the present invention, the memory material comprises a phase-change material and a dielectric material where the phase-change material has a plurality of detectable resistivity values and can be set directly to one of said resistivity values without the need to be set to a specific starting or erased resistivity value, regardless of the previous resistivity value of the material, in response to an electrical signal. The phase-change materials and dielectric materials are those described herein. The memory material may be a heterogeneous mixture of the phase-change material and the dielectric material. Alternately, the memory material may be a homogeneous mixture of the phase-change material and the dielectric material.

Generally, the phase-change material of the present invention is formed from a plurality of constituent atomic elements. Preferably, the phase-change material includes one or more elements selected from the group consisting of Te, Se, Ge, Sb, Bi, Pb, Sn, As, S, Si, P, O and mixtures or alloys thereof. The phase-change material preferably includes at least one chalcogen element and may include at least one transition metal element.

Preferably, the chalcogen element is selected from the group consisting of Te, Se and mixtures or alloys thereof. More preferably, the chalcogen element is a mixture of Te and Se.

The term "transition metal" as used herein includes elements 21 to 30, 39 to 48, 57 and 72 to 80. Preferably, the transition metal element is selected from the group consisting of Cr, Fe, Ni, Nb, Pd, Pt and mixtures or alloys thereof. Most preferably the transition metal is Ni. Specific examples of such multi-element systems are set forth hereinafter with respect to the Te:Ge:Sb system with or without Ni and/or Se.

Specifically, the tellurium alloys described herein have a valence band made up of lone pair states. Since four (4) p shell electrons are present in Te, and the Te atom is chemically bonded by two of these bonding electrons in the p shell, the other two outer electrons (the lone pair) are not utilized for bonding purposes and hence do not substantially change the atomic energy of the system. In this regard, note that the highest filled molecular orbital is the orbital which contains the lone pair electrons. This is significant because, in a perfect stoichiometric crystal of tellurium and germanium atoms, upon the application of some internal strain in the lattice from which the crystallite is formed, the valence band can broaden and move upward toward the position of the then existing Fermi level. However, TeGe crystals are naturally "self-compensated", that is, the crystal desires to preferentially assume a Te rich (approximately 52 percent Te and 48 percent Ge) composition. The stoichiometric crystal is a face centered cube; however, with the addition of a minimal amount of energy, the crystal can assume a rhombohedral lattice structure by increasing the number of its Ge and/or Sb vacancies. It is this creation of vacancies in the crystalline lattice structure, which can reduce lattice strain in TeGe alloys, is responsible for lowering the energy state of the material and moves the Fermi level toward the valence band.

It is acceptable, if not essential to superimpose an amorphous model of local order on top of a short range local order model for the purpose of obtaining a descriptive, if not perfectly predictive explanation of atomic behavior. When considering the amorphous nature of the material, note that the density of defect states in the band tails is greatest adjacent the band edges, while the depth of the recombination centers for captured charge carriers are deeper farther away from the band edges. The presence of these deep traps and tail states would provide a possible explanation for intermediate stable resistance values between the Fermi level position and the band edge. Regardless of theory, when fully crystalline, the semiconductor material of the instant invention is a degenerate semiconductor which exhibits metallic-like conduction.

It is further believed that the size of the crystallites which exist in the bulk of the semiconductor and memory material is relatively small, preferably less than about 2000 Å, more preferably between about 50 Å and 500 Å, and most preferably on the order of about 200 Å to about 400 Å. Further, these crystallites are believed to be surrounded by an amorphous skin which may contribute to the rapid formation of the many Fermi level positions of the material, detectable as different resistances (conductivities), as well as to the lower energy requirements for the transitions between these detectable resistance values to which the material can be reliably and repeatably set.

It has also been found that modulation of the switching characteristics of two or three terminal semiconductor devices fabricated from the microcrystalline materials of the present invention may be controlled such that repeatable and detectable resistance values can be effected. It has been found that, in order for the materials of the present invention to be quickly set by low energy input signals to a desired conductivity (determined by the Fermi level position), it is only necessary that said materials are capable of stable (or long lived metastable) existence within at least two different Fermi level positions, which Fermi level positions are characterized by substantially constant band gaps but different electrical conductivities. As noted above, it is also believed that the relatively small crystallite size may contribute to the rapid transition between detectable values of resistance.

Many of the phase-change materials of the present invention have a tendency toward the formation of more and smaller crystallites per unit volume. Crystallite sizes of the widest preferential range of representative materials embodying the present invention have been found to be far less than about 2000 Å, and generally less than the range of about 2,000 Å to 5,000 Å which was characteristic of prior art materials. Crystallite size is defined herein as the diameter of the crystallites, or of their "characteristic dimension" which is equivalent to the diameter where the crystallites are not spherically shaped.

It has been determined that compositions in the highly resistive state of the class of TeGeSb materials which meet the criteria of the present invention are generally characterized by substantially reduced concentrations of Te relative to that present in prior art electrically erasable memory materials. Examples of TeGeSb materials are provided in commonly assigned U.S. Pat. Nos. 5,534,711, 5,536,947, and 5,596,522.

In one composition that provides substantially improved electrical switching performance characteristics, the average concentration of Te in the as deposited materials was well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. The percentages given are atomic percentages which total 100% of the atoms of the constituent elements. Thus, this composition may be characterized as $Te_a Ge_b Sb_{100-(a+b)}$. These ternary Te—Ge—Sb alloys are useful starting materials for the development of additional phase-change materials having even better electrical characteristics.

The phase-change materials of the present invention preferably include at least one chalcogen and may include one or more transition metals. The phase-change materials which include transition metals are elementally modified forms of the phase-change materials in the Te—Ge—Sb ternary system. That is, the elementally modified phase-change materials constitute modified forms of the Te—Ge—Sb phase-change alloys. This elemental modification is achieved by the incorporation of transition metals into the basic Te—Ge—Sb ternary system, with or without an additional chalcogen element, such as Se. Generally the elementally modified phase-change materials fall into two categories.

The first category is a phase-change material which includes Te, Ge, Sb and a transition metal, in the ratio $(Te_a Ge_b Sb_{100-(a+b)})_c TM_{100-c}$ where the subscripts are in atomic percentages which total 100% of the constituent elements, wherein TM is one or more transition metals, a and b are as set forth herein above for the basic Te—Ge—Sb ternary system and c is between about 90% and about 99.99%. The transition metal preferably include Cr, Fe, Ni, Nb, Pd, Pt and mixtures or alloys thereof.

Specific examples of phase-change materials encompassed by this system would include $(Te_{56}Ge_{22}Sb_{22})_{95}Ni_5$, $(Te_{56}Ge_{22}Sb_{22})_{90}Ni_{10}$, $(Te_{56}Ge_{22}Sb_{22})_{95}Cr_5$, $(Te_{56}Ge_{22}Sb_{22})_{90}Cr_{10}$, $(Te_{56}Ge_{22}Sb_{22})_{95}Fe_5$, $(Te_{56}Ge_{22}Sb_{22})_{90}Fe_{10}$, $(Te_{56}Ge_{22}Sb_{22})_{95}Pd_5$, $(Te_{56}Ge_{22}Sb_{22})_{90}Pd_{10}$, $(Te_{56}Ge_{22}Sb_{22})_{95}Pt_5$, $(Te_{56}Ge_{22}Sb_{22})_{95}Pt_{10}$, $(Te_{56}Ge_{22}Sb_{22})_{95}Nb_5$, $(Te_{56}Ge_{22}Sb_{22})_{90}Nb_{10}$, $(Te_{56}Ge_{22}Sb_{22})_{90}Ni_5Cr_5$, $(Te_{56}Ge_{22}Sb_{22})_{90}Ni_5Fe_5$, $(Te_{56}Ge_{22}Sb_{22})_{90}Cr_5Fe_5$, $(Te_{56}Ge_{22}Sb_{22})_{90}Pd_5Cr_5$, $(Te_{56}Ge_{22}Sb_{22})_{90}Ni_5Pd_5$, $(Te_{56}Ge_{22}Sb_{22})_{90}Pd_5Pt_5$, etc.

The second category is a phase-change material which includes Te, Ge, Sb, Se and a transition metal, in the ratio $(Te_a Ge_b Sb_{100-(a+b)})_c TM_d Se_{100-(c+d)}$ where the subscripts are in atomic percentages which total 100% of the constituent elements, TM is one or more transition metals, a and b are as set forth hereinabove for the basic Te—Ge—Sb ternary system, c is between about 90% and 99.5% and d is between about 0.01% and 10%. The transition metal can preferably include Cr, Fe, Ni, Pd, Pt, Nb and mixtures or alloys thereof. Specific examples of memory materials encompassed by this system would include $(Te_{56}Ge_{22}Sb_{22})$ $_{90}Ni_5Se_5$, $(Te_{56}Ge_{22}Sb_{22})$ $_{80}Ni_{10}Se_{10}$, $(Te_{56}Ge_{22}Sb_{22})$ $_{90}Cr_5Se_5$, $(Te_{56}Ge_{22}Sb_{22})$ $_{80}Cr_{10}Se_{10}$, $(Te_{56}Ge_{22}Sb_{22})$ $_{90}Fe_5Se_5$, $(Te_{56}Ge_{22}Sb_{22})$ $_{80}Fe_{10}Se_{10}$, $(Te_{56}Ge_{22}Sb_{22})$ $_{90}Pd_5Se_5$, $(Te_{56}Ge_{22}Sb_{22})$ $_{80}Pd_{10}Se_{10}$, $(Te_{56}Ge_{22}Sb_{22})$ $_{90}Pt_5Se_5$, $(Te_{56}Ge_{22}Sb_{22})$ $_{80}Pt_{10}Se_{10}$, $(Te_{56}Ge_{22}Sb_{22})$ $_{90}Nb_5Se_5$, $(Te_{56}Ge_{22}Sb_{22})$ $_{80}Nb_{10}Se_{10}$, $(Te_{56}Ge_{22}Sb_{22})$ $_{85}Ni_5Cr_5Se_5$, $(Te_{56}Ge_{22}Sb_{22})$ $_{80}Ni_5Fe_5Se_{10}$, $(Te_{56}Ge_{22}Sb_{22})$ $_{85}Cr_5Fe_5Se_5$, $(Te_{56}Ge_{22}Sb_{22})$ $_{85}Ni_5Pd_5Se_5$, $(Te_{56}Ge_{22}Sb_{22})$ $_{80}Ni_5Pt_5Se_{10}$, $(Te_{56}Ge_{22}Sb_{22})$ $_{85}Ni_5Nb_5Se_5$, $(Te_{56}Ge_{22}Sb_{22})$ $_{85}Pd_5Cr_5Se_5$, $(Te_{56}Ge_{22}Sb_{22})$ $_{80}Pd_5Pt_5Se_{10}$, $(Te_{56}Ge_{22}Sb_{22})$ $_{85}Pd_5Nb_5Se_5$, $(Te_{56}Ge_{22}Sb_{22})$ $_{85}Pt_5Nb_5Se_5$, etc.

The phase-change material possesses substantially non-volatile set resistance values. However, if the resistance value of the phase-change material does drift from its original set value, "compositional modification", described hereinafter, may be used to compensate for this drift. As used herein, the term "non-volatile" refers to the condition in which the set resistance value remains substantially constant for archival time periods. Of course, software (including the feedback system discussed hereinafter) can be employed to insure that absolutely no "drift" occurs outside of a selected margin of error. Because drift of the resistance value of the memory elements can, if left unimpeded, hinder gray scale storage of information, it is desirable to minimize drift.

"Compositional modification" is defined herein to include any means of compositionally modifying the phase-change material to yield substantially stable values of resistance, including the addition of band gap widening elements to increase the inherent resistance of the material. One example of compositional modification is to include graded compositional inhomogeneities with respect to thickness. For instances, the volume of phase-change material may be graded from a first Te—Ge—Sb alloy to a second Te—Ge—Sb alloy of differing composition. The compositional grading may take any form which reduces set resistance value drift. For example, the compositional grading need not be limited to a first and second alloy of the same alloy system. Also, the grading can be accomplished with more than two alloys. The grading can be uniform and continuous or it can also be non-uniform or non-continuous. A specific example of compositional grading which results in reduced resistance value drift includes a uniform and continuous grading of $Ge_{14}Sb_{29}Te_{57}$ at one surface to $Ge_{22}Sb_{22}Te_{56}$ at the opposite surface.

Another manner of employing compositional modification to reduce resistance drift is by layering the volume of phase-change material. That is, the volume of phase-change material may be formed of a plurality of discrete, relatively thin layers of differing composition. For example, the volume of phase-change material may include one or more pairs of layers, each one of which is formed of a different Te—Ge—Sb alloy. Again, as was the case with graded compositions, any combination of layers which results in substantially reduced resistance value drift can be employed. The layers may be of similar thickness or they may be of differing thickness. Any number of layers may be used and multiple layers of the same alloy may be present in the volume of memory material, either contiguous or remote from one another. Also, layers of any number of differing alloy composition may be used. A specific example of compositional layering is a volume of memory material which includes alternating layer pairs of $Ge_{14}Sb_{29}Te_{57}$ and $Ge_{22}Sb_{22}Te_{56}$.

Yet another form of compositional inhomogeneity to reduce resistance drift is accomplished by combining compositional grading and compositional layering. More particularly, the aforementioned compositional grading may be combined with any of the above described compositional layering to form a stable volume of memory material. Exemplary volumes of phase-change material which employ this combination are: (1) a volume of phase-change material which includes a discrete layer of $Ge_{22}Sb_{22}Te_{56}$ followed by a graded composition of $Ge_{14}Sb_{29}Te_{57}$ and $Ge_{22}Sb_{22}Te_{56}$ and (2) a volume of phase-change material which includes a discrete layer of $Ge_{14}Sb_{29}Te_{57}$ and a graded composition of $Ge_{14}Sb_{29}Te_{57}$ and $Ge_{22}Sb_{22}Te_{56}$.

As discussed, the composite memory material is a mixture of a phase-change material, such as those described above, and a dielectric material. Generally, dielectric materials are "[m]aterials which are electrical insulators or in which an electric field can be sustained with a minimum dissipation of power. A solid is a dielectric if its valence band is full and is separated from the conduction band by at least 3 eV." *McGraw-Hill Encyclopedia of Physics*, Second Edition, 1993, page 283. The dielectric materials used herein can be any dielectric material that is chemically non-reactive with the phase-change material. Preferably, the dielectric material has a melting point higher than that of the phase-change material.

In particular, the dielectric material may be one or more materials selected from the group consisting of oxides, nitrides, fluorides, sulfides, chlorides, carbides, oxynitrides, carboxynitrides, borides, phosphides and mixtures or alloys thereof. Other dielectric materials known in the art may also be used. The dielectric material may also be chosen from the group of organic dielectric materials. These include, but are not limited to, materials such as amides, polyamides, imides, polyimides, and parylens.

Oxides include silicon oxides such as $SiO_2$, titanium oxides such as $TiO_2$, aluminum oxides such as $Al_2O_3$, zirconium oxides such as $ZrO_2$, germanium oxides such as $GeO_2$, and tatalum oxides such as $Ta_2O_5$. Other possible oxides include $B_2O_3$, $Sb_2O_3$, and $PbO$. Nitrides include silicon nitrides such as $Si_3N_4$, aluminum nitrides such as AlN, as well as TiN, SiN, ZrN and BN, and off-stoichiometry silicon nitride $SiN_x$. Sulfides include silicon sulfide such as $SiS_2$, germanium sulfide such as $GeS_2$, and zinc sulide such as ZnS. Florides include $MgF_2$, $CaF_2$, and $LiF_2$.

Various glasses may also be used. For instance, LaSiON material containing La, Si, O and N; SiAlON material containing Si, Al, O and N; SiAlON material containing yttrium; or NdSiON material containing Nd, Si, O and N may be used.

The composite memory material is a heterogeneous mixture of active phase-change material and inactive dielectric material. One embodiment of such a heterogeneous mixture is that of a multi-layered structure with layers of phase-change material intermixed with layers of dielectric material. Preferably, the thickness of each layer may be between about 5 Å to about 75 Å. More preferably, the thickness of each layer may be between about 10 Å to about 50 Å. Most preferably, the thickness of each layer may be between about 20 Å to about 30 Å.

The composite memory material may be made by methods such as sputtering, evaporation or by chemical vapor deposition (CVD), which may be enhanced by plasma techniques such as RF glow discharge. The composite memory material of the instant invention is most preferably made by RF sputtering or evaporation. It may be formed by multiple source sputtering techniques making use of a plurality of targets, usually a target of the phase-change material and a target of the dielectric material. With these targets arranged in opposition to a substrate, sputtering is carried out while the substrate is rotated relative to each target. A target containing both phase-change and dielectric materials may be used as well. As well, substrate heating may be used to control the morphology of the phase-change material within the composite memory material formed by affecting crystal growth as well as crystal aggregation via surface mobility.

The percentage by volume of dielectric material within the composite memory material can be controlled. Preferably, the percentage by volume of the inactive dielectric material is phase-change material is between about 60% and 90%. More preferably, the percentage by volume of dielectric material is between about 75% and 87%. Most preferably, the percentage by volume of dielectric material is between about 80% and about 84%.

The composite memory material may also be formed by a spin coating process. The phase-change material may be a heterogeneous mixture of a phase-change material and a dielectric such as an organic polymer like polyamide. The resulting mixture may then be spin coated onto a silicon substrate forming a composite memory material with the desired properties.

The single-cell memory element of the present invention comprises the volume of composite memory material disclosed above. The memory element further comprises means for delivering an electrical signal to at least a portion of the volume of composite memory material. The "electrical signal" is preferably an electric current. "Electric current" is the flow of electric charge. Examples of electric charge are electrons, protons, positive and negative ions, and any other type of charged particle. The flow of electric charge may be due to a beam of charged particles such as an electron beam or a proton beam. The electrical signal may also be an electric voltage.

In one embodiment of the present invention, the means for delivering is a first contact and a second contact. Each of the contacts is adjoining the volume of memory material. As used herein, a contact is "adjoining" the volume of memory material if at least a portion of the contact is actually touching the memory material.

Figure 1:
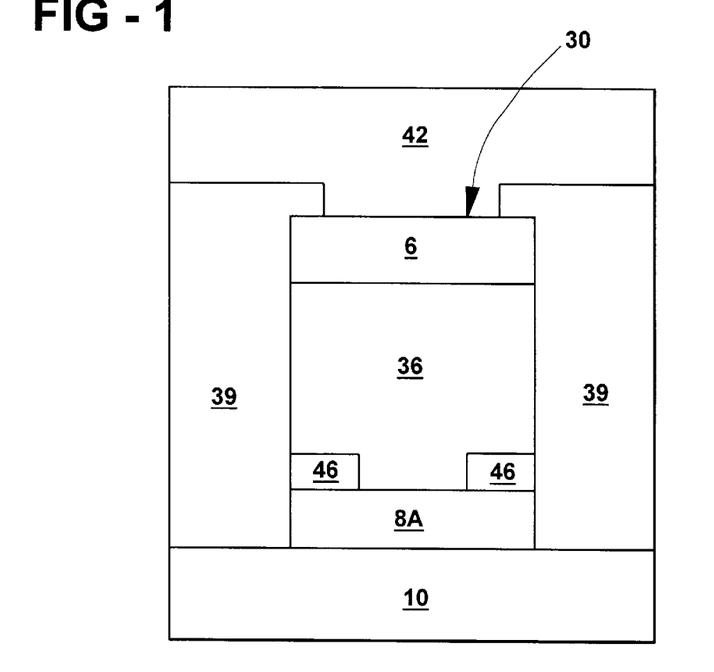
FIG. 1 is a cross-sectional view of a memory element of the present invention having a first and second contact each adjoining the volume of memory material.

In one embodiment of the invention, the first and second contacts are a pair of spacedly disposed planar contacts adjoining the volume of memory material. Each of the contacts may be comprised of one or more thin-film contact layers. FIG. 1 shows a cross-sectional view of an embodiment of the memory element formed on a single crystal silicon semiconductor wafer 10. The memory element includes the composite memory material 36, a first spacedly disposed contact 6 adjoining the volume of memory material, and a second spacedly disposed contact 8A adjoining the volume of memory material. In the embodiment shown, the first and second contacts 6, 8A are planar contacts. At least one of the contacts 6, 8A may comprise one or more thin-film layers. One embodiment of the invention, wherein the first and second contacts 6, 8A comprise two thin-film layers was disclosed in commonly assigned U.S. patent application Ser. No. 08/739,080, the disclosure of which is incorporated herein by reference. U.S. patent application Ser. No. 08/739,080 discusses the materials from which each of the thin-film layers may be formed.

In one embodiment of the invention at least one of the contacts 6, 8A comprises a thin-film layer adjoining the volume of memory material wherein said thin-film layer includes one or more elements selected from the group consisting of Ti, V, Cr, Zr, Nb, Mo, Hf, Ta, W and mixtures or alloys thereof in combination with two or more elements selected from the group consisting of B, C, N, O, Al, Si, P, S and mixtures or alloys thereof. Examples of materials include TiCN, TiAlN, TiSiN, W—$Al_2O_3$, and Cr—$Al_2O_3$.

The layer of memory material 36 is preferably deposited to a thickness of about 200 Å to 5,000 Å, more preferably of about 250 Å to 2,500 Å, and most preferably of about 250 Å to 500 Å in thickness.

The memory element shown in FIG. 1 may be formed in a multi-step process. Contact layer 8A, and insulation layer 46 are first deposited and the insulation layer 46 is then etched so that there will be an area of contact between the memory material 36 and contact layer 8A. Memory layer 36 and contact layer 6 are then deposited and the entire stack of layers 8A, 46, 36 and 6 are etched to the selected dimensions. Deposited on top of the entire structure is a layer of insulating material 39. Examples of insulating materials are $SiO_2$, $Si_3N_4$ and tellurium oxygen sulfide (e.g., TeOS). The layer of insulating material 39 is etched and a layer of aluminum 42 is deposited to form the second electrode grid structure 42 which extends perpendicular in direction to the conductors 12 and complete the X-Y grid connection to the individual memory elements. Overlaying the complete integrated structure is a top encapsulating layer of a suitable encapsulant such as $Si_3N_4$ or a plastic material such as polyamide, which seals the structure against moisture and other external elements which could cause deterioration and degradation of performance. The $Si_3N_4$ encapsulant can be deposited, for example, using a low temperature plasma deposition process. The polyamide material can be spin coated and baked after deposition in accordance with known techniques to form the encapsulant layer.

Figure 2:
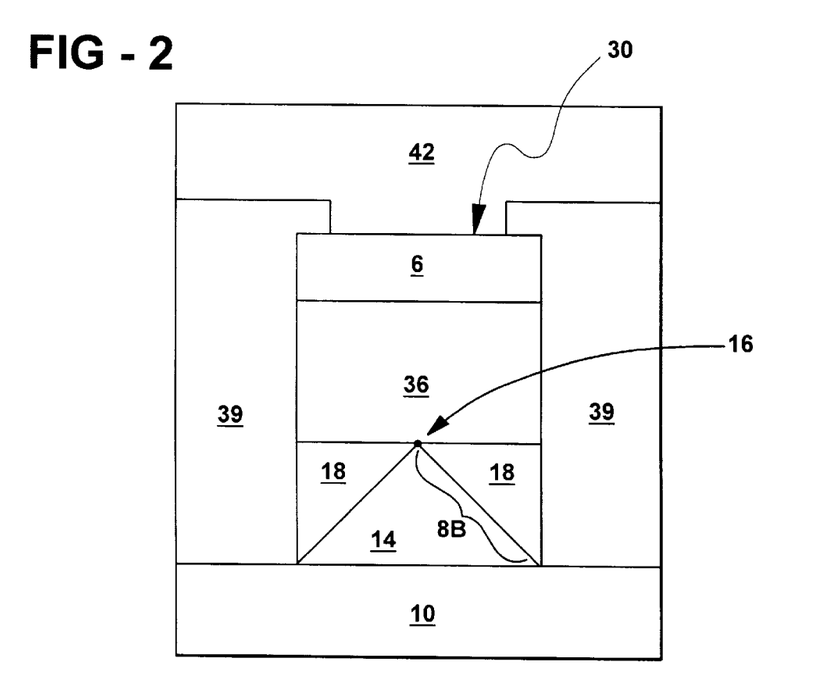
FIG. 2 is a cross-sectional view of a memory element of the present invention having a contact tapering to a peak adjoining the volume of memory material.

In another embodiment of the invention, the means for delivering comprises at least one "tapered" contact. A tapered contact is a contact which tapers to a peak adjoining the volume of memory material. FIG. 2 shows an embodiment of a memory element comprising a first contact 6 and a second contact 8B where the first contact 6 is a planar contact and the second contact 8B is a tapered cotact that tapers in cross-sectional area to a peak 16 adjoining the volume of memory material 36. The embodiment of the present invention shown in FIG. 2 is disclosed in commonly assigned U.S. Pat. No. 5,687,112 to Ovshinsky et al, the disclosure of which is incorporated herein by reference.

The first contact 6 may comprise one or more thin-film layers. As disclosed in the '112 Patent, the first contact 6 may comprise two thin-film layers. The tapered contact comprises a "contact tip" 14 that can be formed on the silicon substrate 10. The contact tip 14 can be formed in a multi-step process. A patterned oxide layer can be formed on silicon substrate 10 using conventional oxidation and photolithographic techniques. Using the oxide layer as a mask, the silicon substrate is anisotropically etched to form the elongated, tapered structure on top of the silicon substrate 10 that is referred to as a contact tip. Contact tips can be fabricated so that they are conical, pyramidal, elongated or wedge-shaped. Other shapes that come to a point contact with the chalcogenide material are also possible without departing from the spirit or scope of the instant invention.

The peak of the tapered contact can be pointed. Pointed peaks are fabricated by sharpening the contact tips that are etched from the silicon substrate. Sharpening uses a reactive process which includes but is not limited to plasma etching, wet chemical etching or thermal oxidation. Contact tips may also be sharpened electrochemically, for example by placing a bias on a solution, and depositing or etching the contact tips. This process may be used to sharpen molybdenum, tungsten or precious metal contact tips such as platinum, pallium, iridium or gold.

While it is preferred that the peaks are pointed, they need not be atomically sharp. Peaks which are rounded or flat will also suffice provided the cross-sectional diameter of each peak is sufficiently small. Preferably, the cross-sectional diameter of the peak is less than 2000 Å. More preferably, the diameter of the cross-sectional area of the peak is less than 1000 Å. Most preferably, the diameter of the cross-sectional area of the peak is less than 500 Å. Contact tips which are formed having flat peaks can be fabricated as conical, pyramidal, elongated or wedge-shaped frustums. In the most preferable embodiment, the diameter of the peak will approximate the diameter of the filamentary pore (the conduction path) formed through the body of chalcogenide material. As disclosed in the '112 Patent, an alternate structure for the second contact 8 is one in which the contact tip 14 is offset from the silicon substrate by an elongated column.

The spaces formed in the silicon substrate 10 by the etching process are filled by depositing a suitable dielectric 18 on top of the second contact, Examples of suitable dielectric materials that may be used are TeOS, $SiO_2$ or $Si_3N_4$. After deposition of the dielectric material 18, the surface is planarized using chemical mechanical polishing (CMP) techniques.

The specific embodiment of the invention shown in FIG. 2 shows a tapered contact 8B that is positioned below the memory material 36—i.e., between the substrate 10 and memory material 36, while the planar contact 6 is positioned above the memory material. Alternately, the positioning of the two types of contacts may be reversed. Furthermore, in an alternate embodiment of the invention, the first and the second contacts are both tapered contacts tapering to peaks adjoining the volume of memory material. Another embodiment of the present invention is an electrical memory element where the means for delivering is at least one field emitter. Field emitters are discussed in U.S. Pat. No. 5,557,596 to Gibson et al., the disclosure of which is incorporated herein by reference. The field emitter tapers to a peak which is positioned in close proximity to the volume of memory material. As defined herein, the terminology "in close proximity" means that the field emitter does not actually make contact with the volume of memory material. Preferably, the field emitter is placed between about 50 Å and about 100,000 Å from the volume of memory material. More preferably, the field emitter is placed between about 500 Å and about 50,000 Å from the volume of memory material.

The field emitter generates an electron beam from its tapered peak. As discussed in the '596 Patent, the electron beam may be extracted from the field emitter in many different ways. In one embodiment, a circular gate is positioned around the field emitter and an electric potential is placed between the field emitter and the gate. In another embodiment an electric potential may be placed between the field emitter and the actual volume of memory material. In still another embodiment, a contact (such as a planar contact) may be positioned adjoining the volume of memory material and spacedely disposed from the field emitter. An electric potential may be placed between the field emitter and the planar contact so that the electron beam is urged toward the volume of memory material and impinges the memory material. It is further noted that more than one field emitter may be used.

The field emitters may be made in a number of ways. One way is discussed in "Physical Properties of Thin-Film Field Emission Cathods With Molybdenum Cones", by Spindt et al, published in the Journal of Applied Physics, Vol. 47, No. 12, December 1976. Another way is discussed "Fabrication and Characteristics of Si Field Emitter Arrays," by Betsui, published in Tech. Digest 4th Int. Vacuum Microelectronics Conf., Nagahama, Japan, page 26, 1991.

In one embodiment of the present invention, a partial vacuum exists between the field emitter and the volume of memory material. As discussed in the '596 Patent, the partial vacuum may be at least $10^{-5}$ torr. Methods of fabricating field emitters in vacuum cavities are known in the art. Techniques are discussed in "Silicon Field Emission Transistors and Diodes," by Jones, published in IEEE Transactions on Components, Hybrids and Manufacturing Technology, 15, page 1051, 1992. Alternately, a gas may be interposed between the field emitter and the volume of memory material.

In yet another embodiment of the present invention, the means for delivering electric current is a tunneling contact which is placed in close proximity to the volume of memory material. The tunneling contact may be similar to a field emitter. It may taper to a peak that is positioned is close proximity to the volume of memory material. The tunneling contact does not actually touch the memory material, however, it is positioned within the quantum mechanical tunneling distance. Preferably, this distance is less than 50 Å.

In embodiments of the memory element wherein the means for delivering is a first and second contact, the term "pore diameter" is applicable. As used herein, the term "pore diameter" is defined as the average cross-section of the smallest region of contact between the memory material and said first and second electrical contacts. For example, in the embodiment of the invention shown in FIG. 1, the pore diameter is the average cross-section of the region of contact between memory material 36 and contact 8A. As well, in the embodiment of the invention shown in FIG. 2, the pore diameter is the average cross-section of the region of contact between the memory material 36 and contact 8B. The pore diameter can be as small as lithography resolution limits will permit.

Pore diameter is related to device performance. Reducing pore diameter reduces device volume, thereby lowering the current and energy requirements needed for electrical switching. This increases the speed and sensitivity of the device—reducing the switching time and electrical energy required to initiate the detectable change in resistance.

In previous embodiments of the memory element, the programming current required for electrical cycling was decreased by a lithographic reduction of pore diameter. In contradistinction thereto, in a memory element comprising the memory material of the present invention, the desired decrease in programming current is achieved by restricting the volume of phase-change material via the introduction of the dielectric material.

The dielectric material can be made to occupy a selected volume fraction of the memory material thus reducing the volume fraction occupied by the phase-change material. This reduction of volume fraction of phase-change material decreases the current needed to program the memory element.

Because the volume fraction of dielectric material can be controlled, in thin-film memory applications, the volume of electrically conducting material can be controlled independently of the size of the photolithographically defined contact area. This can allow a reduction in the required programming current at a given scale of photolithography to a value consistent with the current that can be supplied by the memory drivers.

Figure 3:
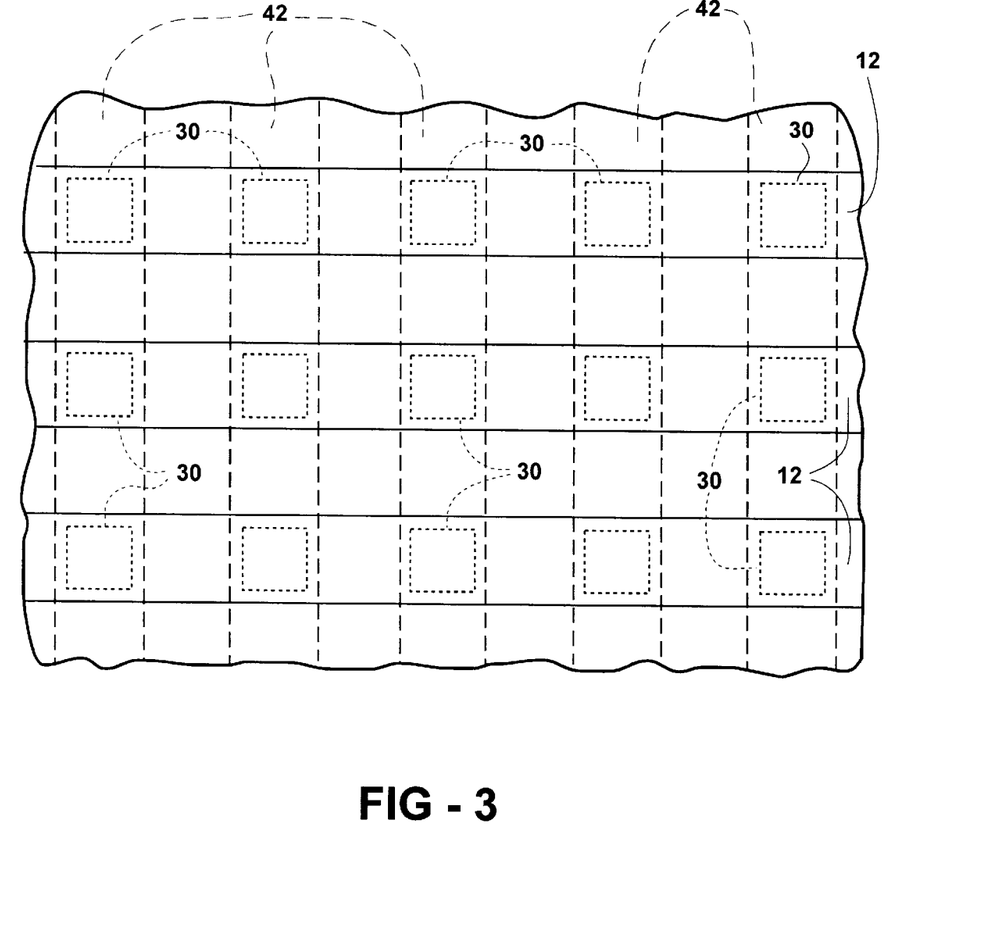
FIG. 3 is the top view of a possible layout of multiple memory elements showing how the elements would be connected to a set of X-Y addressing lines.

The top view of a possible configuration for multiple memory elements is shown in FIG. 3. As shown, the devices form an X-Y matrix of memory elements. The horizontal strips 12 represent the X set of an X-Y electrode grid for addressing the individual elements. The vertical strips 42 represent the Y set of addressing lines.

Other circuit configurations for the electrically erasable memory of the present invention are, of course, possible and feasible to implement. One particularly useful configuration is a three dimensional, multilevel array in which a plurality of planes of memory or control elements and their respective isolation devices are stacked upon one another. Each plane of memory elements is arranged as a plurality of rows and columns of memory elements, thereby allowing for X-Y addressing. This stacking of planes, in addition to increasing memory storage density, allows for an additional Z dimension of interconnection. This arrangement is particularly useful to simulate a neural network for a truly intelligent computer.

Figure 4:
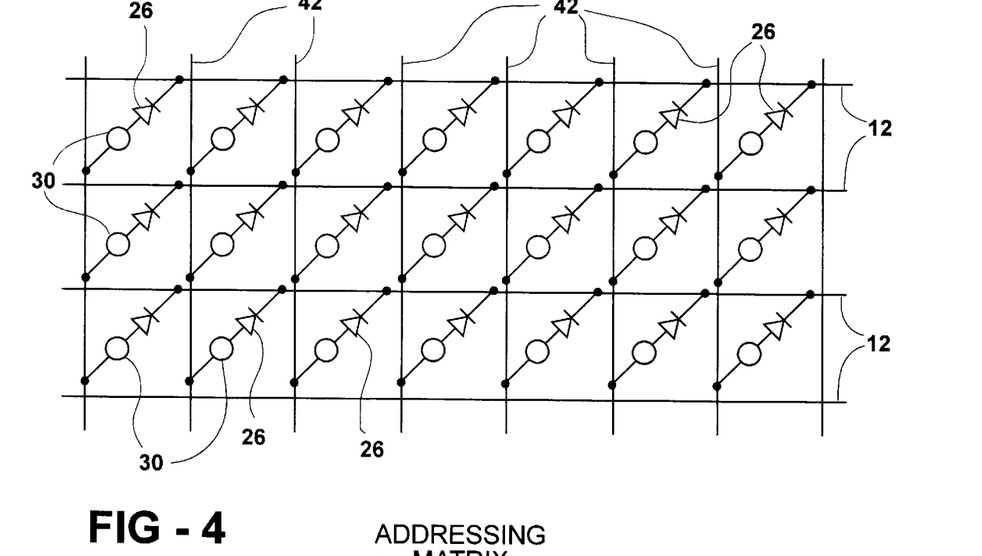
FIG. 4 is a schematic diagram of the memory elements from FIG. 1 showing, in addition, how isolation elements such as diodes are connected in series with the memory elements to electrically isolate each of the devices from the others.

Each memory element is electrically isolated from the others by using some type of isolation element. FIG. 4, a schematic diagram of the memory device layout, shows how electrical isolation can be accomplished using diodes. The circuit comprises an X-Y grid with the memory elements 30 being electrically interconnected in series with isolation diodes 26. Address lines 12 and 42 are connected to external addressing circuitry in a manner well known to those skilled in the art. The purpose of the isolation elements is to enable each discrete memory elements to be read and written without interfering with information stored in adjacent or remote memory elements of the matrix.

Figure 5:
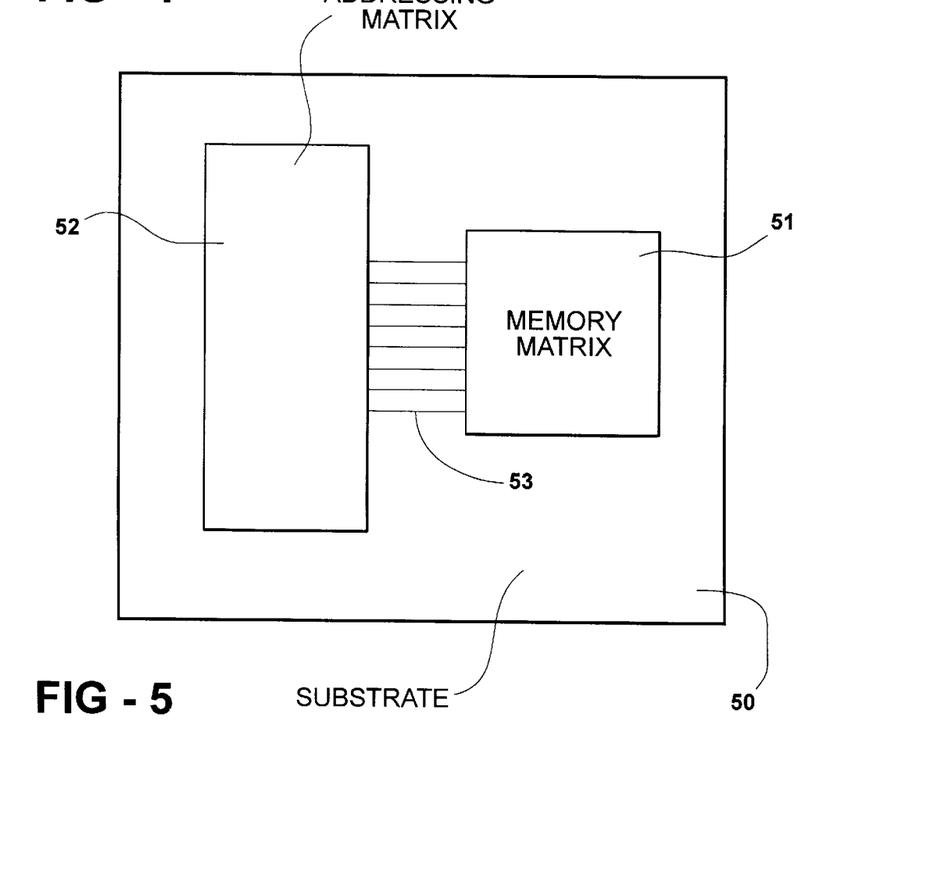
FIG. 5 is a schematic representation illustrating a single crystal semiconductor substrate with the integrated memory matrix of the instant invention as depicted in FIG. 1 placed in electrical communication with an integrated circuit chip on which the address/drivers/decoders are operatively affixed.

FIG. 5 shows a portion of a single crystal semiconductor substrate 50 with a memory matrix 51 of the present invention formed thereon. Also formed on the same substrate 50 is an addressing matrix 52 which is suitably connected by integrated circuitry connections 53 to the memory matrix 51. The addressing matrix 52 includes signal generating means which define and control the setting and reading pulses applied to the memory matrix 51. Of course, the addressing matrix 52 may be integrated with and formed simultaneously with the solid state memory matrix 51.

Experimentation has shown that factors such as chalcogenide composition, thermal preparation (post deposition anneal), signal pulse duration, impurities such as oxygen present in the composition, crystallite size and signal pulse waveform shape have an effect on the magnitude of the dynamic range of resistances, the absolute end-point resistances of said dynamic range, and the voltages required to set the device at these resistances. For example, relatively thick chalcogenide films (i.e. about 4000 Å) will result in higher set voltage requirements (and therefore higher current densities within the volume of memory material), while relatively thin chalcogenide layers (i.e. about 250 Å) will result in lower set voltage (and current density) requirements. Of course, the possible significance of crystallite size and, therefore, the ratio of the number of surface atoms relative to the number of bulk atoms has previously been described.

The dynamic range of resistances also allows for broad gray scale and multilevel analog memory storage. Multilevel memory storage is accomplished by dividing the broad dynamic range into a plurality of sub-ranges or levels. The continuous resistance programmability allows for multiple bits of binary information to be stored in a single memory cell. This multilevel storage is accomplished by mimicking multiple bits of binary information in pseudo-analog form and storing this analog information in a single memory cell. Thus, by dividing the dynamic range of resistances into $2_n$ analog levels, each memory cell would be provided with the capability of storing n bits of binary information.

Through the use of the proprietary materials and device configurations disclosed herein, an electrically erasable, directly overwritable memory element has been developed which provides fast read and write speeds, approaching those of SRAM devices; non-volatility and random access reprogramming capabilities of an EEPROM; and a price per megabyte of storage significantly below any other semiconductor memory.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. An electrically operated, single-cell memory element comprising:
    a volume of memory material comprising a heterogeneous mixture of a phase-change material and a dielectric material, said phase-change material programmable to a plurality of detectable resistivity values in response to an electrical signal, said dielectric material being between about 60 and 90 percent of said volume of memory material; and
    means for delivering said electrical signal to at least a portion of said volume of memory material.

2. The memory element of claim 1, wherein said phase-change material can be set directly to one of said resistivity values without the need to be set to a specific starting or erased resistivity value, regardless of the previous resistivity value of said material, in response to said electrical signal.

3. The memory element of claim 1, wherein said phase-change material includes one or more elements selected from the group consisting of Te, Se, Ge, Sb, Bi, Pb, Sn, As, S, Si, P, O and mixtures or alloys thereof.

4. The memory element of claim 3, wherein said phase-change material includes at least one chalcogen element and at least one transition metal element.

5. The memory element of claim 4, wherein said chalcogen element is selected from the group of Te, Se and mixtures or alloys thereof.

6. The memory element of claim 5, wherein said chalcogen element is a mixture of both Te and Se.

7. The memory element of claim 4, wherein said at least one transition metal element is selected from the group consisting of Cr, Fe, Ni, Nb, Pd, Pt and mixtures or alloys thereof.

8. The memory element of claim 1, wherein said dielectric material is one or more materials selected from the group consisting of oxides, nitrides, fluorides, sulfides, chlorides, carbides, oxynitrides, carboxynitrides, borides, phosphides and mixtures or alloys thereof.

9. The memory element of claim 1, wherein said dielectric material is an organic dielectric material.

10. The memory element of claim 1, wherein said means for delivering is a first contact and a second contact adjoining said volume of memory material.

11. The memory element of claim 1, wherein said means for delivering comprises at least one tapered contact, said tapered contact tapering to a peak adjoining said volume of memory material.

12. The memory element of claim 1, wherein said means for delivering comprises at least one field emitter positioned in close proximity to said volume of memory material.

13. The memory element of claim 1, wherein said means for delivering comprises at least one field emitter positioned within the tunneling distance of said volume of memory material.

14. The memory element of claim 2, wherein said phase-change material has two detectable resistivity values.

15. The memory element of claim 2, wherein said phase-change material has at least three detectable resistivity values.

* * * * *